United States Patent
Zandian et al.

(10) Patent No.: US 9,570,428 B1
(45) Date of Patent: Feb. 14, 2017

(54) TILED HYBRID ARRAY AND METHOD OF FORMING

(71) Applicant: TELEDYNE SCIENTIFIC & IMAGING, LLC, Thousand Oaks, CA (US)

(72) Inventors: Majid Zandian, Calabasas, CA (US); Donald E. Cooper, Moorpark, CA (US); Lisa L. Fischer, Ventura, CA (US); Victor Gil, Woodland Hills, CA (US); Gerard Sullivan, Newbury Park, CA (US)

(73) Assignee: TELEDYNE SCIENTIFIC & IMAGING, LLC, Thousand Oaks, CA (US)

( * ) Notice: Subject to any disclaimer, the term of this patent is extended or adjusted under 35 U.S.C. 154(b) by 0 days.

(21) Appl. No.: 14/994,917

(22) Filed: Jan. 13, 2016

Related U.S. Application Data

(60) Provisional application No. 62/210,844, filed on Aug. 27, 2015.

(51) Int. Cl.
*H01L 25/16* (2006.01)
*H01L 27/146* (2006.01)
(Continued)

(52) U.S. Cl.
CPC ............ *H01L 25/167* (2013.01); *H01L 25/165* (2013.01); *H01L 27/1469* (2013.01); *H01L 27/14618* (2013.01); *H01L 27/14634* (2013.01); *H01L 27/14636* (2013.01); *H01L 27/14696* (2013.01); *H01L 31/0203* (2013.01); *H01L 31/024* (2013.01); *H01L 31/02966* (2013.01); *H01L 31/186* (2013.01); *H01L 33/0045* (2013.01); *H01L 33/0095* (2013.01); *H01L 33/30* (2013.01); *H01L 33/382* (2013.01); *H01L 33/54* (2013.01); *H01L 33/56* (2013.01); *H01L 33/62* (2013.01); *H01L 33/642* (2013.01);
(Continued)

(58) Field of Classification Search
CPC .. H01L 25/167; H01L 33/62; H01L 27/14636; H01L 27/14696; H01L 27/1469; H01L 33/56; H01L 27/14634; H01L 33/0045; H01L 31/02966; H01L 25/165; H01L 2933/0016; H01L 2933/0066
See application file for complete search history.

(56) References Cited

U.S. PATENT DOCUMENTS 4,197,633 A   4/1980   Lorenze, Jr. et al.
4,290,844 A   9/1981   Rotolante et al.
(Continued)

*Primary Examiner* — David Vu
(74) *Attorney, Agent, or Firm* — Koppel, Patrick, Heybl & Philpott

(57) ABSTRACT

A tiled array of hybrid assemblies and a method of forming such an array enables the assemblies to be placed close together. Each assembly comprises first and second dies, with the second die mounted on and interconnected with the first die. Each vertical edge of a second die which is to be located adjacent to a vertical edge of another second die in the tiled array is etched such that the etched edge is aligned with a vertical edge of the first die. Indium bumps are deposited on a baseplate where the hybrid assemblies are to be mounted, and the assemblies are mounted onto respective indium bumps using a hybridizing machine, enabling the assemblies to be placed close together, preferably ≤10 µm. The first and second dies may be, for example. a detector and a readout IC, or an array of LEDs and a read-in IC.

31 Claims, 3 Drawing Sheets

(51) Int. Cl.
  *H01L 31/0296* (2006.01)
  *H01L 33/00* (2010.01)
  *H01L 33/30* (2010.01)
  *H01L 33/62* (2010.01)
  *H01L 33/64* (2010.01)
  *H01L 33/38* (2010.01)
  *H01L 33/54* (2010.01)
  *H01L 33/56* (2010.01)
  *H01L 31/024* (2014.01)
  *H01L 31/0203* (2014.01)
  *H01L 31/18* (2006.01)

(52) U.S. Cl.
  CPC  *H01L 2933/005* (2013.01); *H01L 2933/0016* (2013.01); *H01L 2933/0066* (2013.01)

(56)  References Cited

U.S. PATENT DOCUMENTS

| | | |
|---|---|---|
| 4,352,715 A | 10/1982 | Carson et al. |
| 4,551,629 A | 11/1985 | Carson et al. |
| 4,672,737 A | 6/1987 | Carson et al. |
| 4,783,594 A | 11/1988 | Schulte et al. |
| 5,196,652 A | 3/1993 | Mikkelsen, Jr. et al. |
| 5,446,284 A | 8/1995 | Butler et al. |
| 6,562,127 B1 | 5/2003 | Kud et al. |
| 6,675,600 B1 | 1/2004 | Robillard et al. |
| 7,230,227 B2 | 6/2007 | Wilcken et al. |
| 7,723,815 B1 | 5/2010 | Peterson et al. |
| 7,742,120 B2 | 6/2010 | Bayley et al. |
| 8,305,294 B2 | 11/2012 | Cok et al. |
| 2003/0234343 A1 | 12/2003 | Cok et al. |
| 2006/0108915 A1 | 5/2006 | Cok et al. |
| 2008/0217717 A1 | 9/2008 | Pfister et al. |
| 2015/0083892 A1 | 3/2015 | Cooper et al. |

TILED HYBRID ARRAY AND METHOD OF FORMING

RELATED APPLICATIONS

This application claims the benefit of provisional patent application No. 62/210,844 to Majid Zandian et al., filed Aug. 27, 2015.

BACKGROUND OF THE INVENTION

Field of the Invention

This invention relates generally to tiled arrays of hybrid assemblies, and more particularly to methods of forming such arrays with very small gaps between assemblies.

Description of the Related Art

Many applications require that an array of hybrid assemblies be tiled on a common baseplate. For example, an imaging device may require a tiled array of hybrid assemblies, each of which includes a detector chip and a readout integrated circuit (ROIC).

In some applications, such as an imaging device, it is preferred or essential that the hybrid assemblies in the array be located close to each other—within 10 µm in some cases. Achieving this can be difficult. For example, one or more dies making up a hybrid assembly may need to be sawed, but this can result in rough sidewalls that limit how closely together the assemblies can be located. Another constraint is that the edge of the saw cut cannot be too close to active devices due to the damage the sawing produces, further limiting how closely-spaced active devices on adjacent assemblies can be. In addition, if the hybrid assemblies are conventionally affixed to the baseplate with epoxy, locating the assemblies too closely together can result in epoxy squirting out of the gaps between the assemblies.

A tiled array of hybrid assemblies may also give rise to thermal issues. For example, adjacent dies having different thermal expansion coefficients may result in stress that degrades the performance of one or both of the dies. One way in which this is addressed is shown in FIG. 1. Here, a detector die 1 is interconnected with an ROIC die 2 via a layer of indium bumps and epoxy 3. To help equalize the thermal expansion coefficients between dies 1 and 2, the dies may be affixed to a metal layer 4 with an epoxy layer 5, which is in turn affixed to a silicon layer 6 with an epoxy layer 7, which is then affixed to a baseplate 8 with an epoxy layer 9. However, this approach requires a costly and complex fabrication process, with the multiple epoxy layers located between die 2 and baseplate 8 degrading thermal performance.

SUMMARY OF THE INVENTION

A tiled array of hybrids and a method of forming such an array is presented, which enables the hybrid assemblies to be placed very close to each other.

The present method forms a tiled array of hybrid assemblies on a baseplate. Each hybrid assembly comprises a first die and a second die, with the second die mounted on and interconnected with the first die. The side of the first die opposite the second die is referred to as the hybrid assembly's bottom side.

Each vertical edge of a second die which is to be located adjacent to a vertical edge of another second die in the tiled array is etched such that the etched vertical edge is aligned with a vertical edge of the first die. A plurality of indium bumps is deposited on a baseplate where the hybrid assemblies are to be mounted. The bottom sides of the hybrid assemblies are then mounted onto respective indium bumps using a hybridizing machine. The hybridizing machine is capable of precisely locating the hybrids on the baseplate. By etching the vertical edges as described and using a hybridizing machine, the hybrid assemblies can be placed very close together, preferably ≤10 µm.

The first die may be, for example, a readout IC (ROIC) and the second die a detector comprising an array of detector pixels mounted on and interconnected with the ROIC. Another possible hybrid assembly might include a first die comprising a read-in IC (RIIC) and a second die comprising an array of LEDs mounted to and interconnected with the RIIC.

These and other features, aspects, and advantages of the present invention will become better understood with reference to the following drawings, description, and claims.

DETAILED DESCRIPTION OF THE INVENTION

Figure 1:
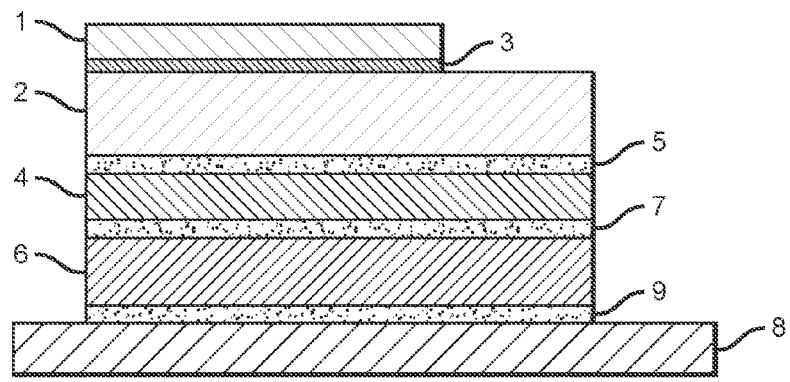
FIG. 1 is a sectional view of a known hybrid assembly.

The present method is directed to forming a tiled array of hybrid assemblies which can be very close together. The method is suitable for use with hybrid assemblies such as that illustrated in FIG. 2. The hybrid assembly 10 includes a first die 12 and a second die 14 mounted on and interconnected with the first die. The dies are typically interconnected using indium bumps and bonded together with an epoxy; these are employed in layer 16 between the dies. The side 18 of the first die opposite the second die is referred to herein as the hybrid assembly's 'bottom side'.

Figure 2:
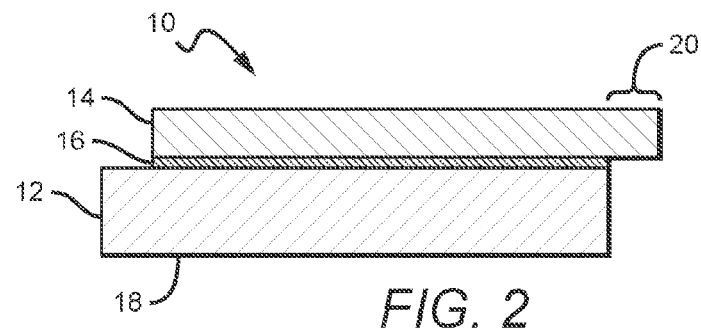
FIG. 2 is a sectional view of a hybrid assembly as might be used in a tiled array per the present invention.

In some applications, it is desirable or essential to form a tiled array of such hybrid assemblies such that they are very close together. For example, for an array of hybrid assemblies that each include a detector which includes a plurality of detector pixels (e.g., a 2 k×2 k array), and a readout IC (ROIC), it may be necessary to be able to locate the assemblies such that they are no more than a single pixel apart. This may be impossible using conventional techniques. For example, detector dies are commonly diced using a saw, which can leave rough edges. Furthermore, to avoid mechanical damage to pixels near the edge being sawed may require that a buffer zone be included between the outermost pixels and the dicing edge. This is illustrated in FIG. 2: assume second die 14 is a detector and first die 12 is an ROIC. To protect the rightmost pixels on detector 14, an unused buffer area 20 is included between the edge of the saw cut and the first electrically active detector. However, the presence of such a buffer area prevents a plurality of hybrid assemblies to be tiled closely together.

To enable the hybrid assemblies to be located closely together in a tiled array on a common baseplate, these buffer areas must be eliminated and adjacent vertical edges must be precisely defined. This is accomplished by etching each vertical edge of the second dies which is to be located adjacent to a vertical edge of another second die in the tiled array such that the etched vertical edge is aligned with a vertical edge of the first die.

Figure 3A:
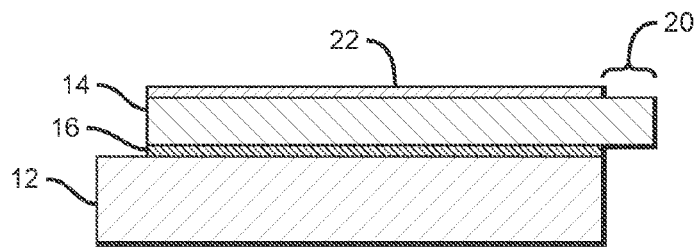
FIGS. 3A and 3B illustrate the use of a wet etch on a hybrid assembly as might be used in a tiled array per the present invention
Figure 3B:
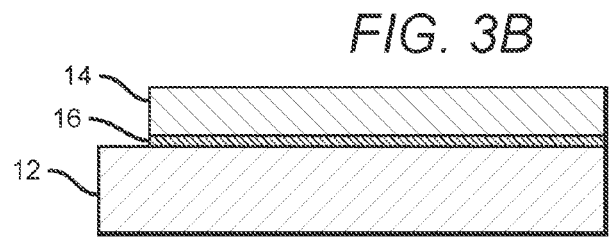

It is preferable to use a wet etch in some cases, and a dry etch in others. A wet etching process is illustrated in FIGS. 3A and 3B. This might be preferred if, for example, the first die comprises an ROIC, and the second die 14 comprises a detector—such as a mercury cadmium telluride (MCT) detector—comprising an array of detector pixels mounted on and interconnected with the ROIC. The MCT detector is typically grown and fabricated on a CdZnTe substrate. Since plasma etching of MCT on CdZnTe can result in mechanical damage that propagates for long distances, a wet etch is used, preferably with the CdZnTe having been thinned to a few microns (not shown in FIGS. 3A and 3B). A photoresist layer 22 is deposited on the surface of second die 14 opposite the first die to define an area that is not to be etched. The surface of second die 14 is then wet etched such that any portion 20 of the second die which extends beyond a vertical edge of first die 12 is substantially removed. The result of this process is shown in FIG. 3B. With the etch completed, the rightmost vertical edge of die 14 is now aligned with the rightmost vertical edge of die 12.

Figure 4A:
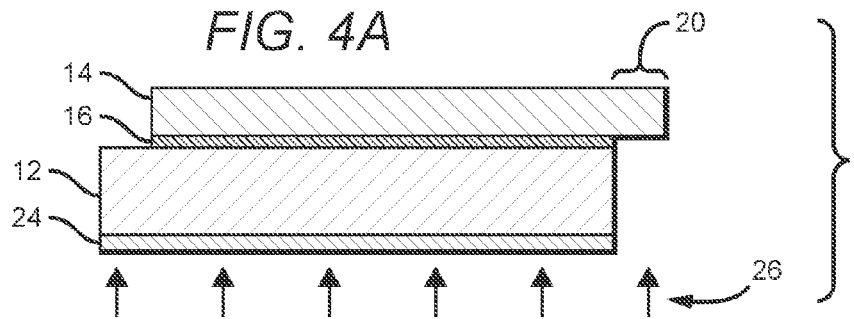
FIGS. 4A and 4B illustrate the use of a dry etch on a hybrid assembly as might be used in a tiled array per the present invention.
Figure 4B:
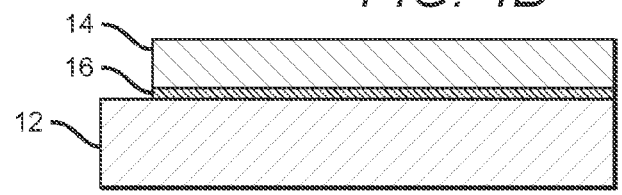

A dry etching process is illustrated in FIGS. 4A and 4B. This might be preferred if, for example, the first die 12 comprises a RIIC and the second die 14 comprises an array of superlattice LEDs ("SLEDs") on a substrate, mounted on and interconnected with the RIIC. Here, a layer 24 is deposited on the surface of first die 12 opposite second die 14, with layer 24 being resistant to a dry etchant. A dry etch—typically using plasma etching ions 26—such that first die 12 serves as an etching mask so that any portion 20 of second die 14 which extends beyond a vertical edge of the first die is substantially removed. The result of this process is shown in FIG. 4B. With the etch completed, the rightmost vertical edge of die 14 is now aligned with the rightmost vertical edge of die 12.

Figure 5:
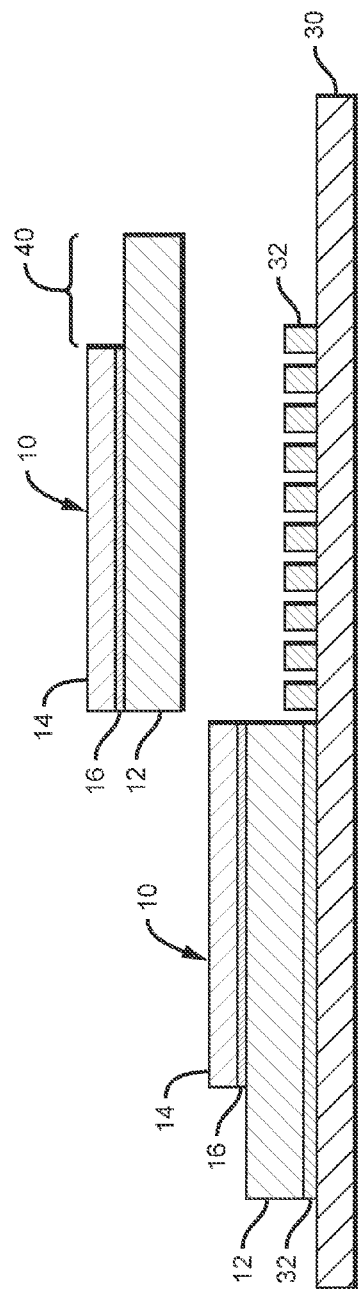
FIG. 5 illustrates the placement of hybrid assemblies on a common baseplate using indium bumps to form a tiled array per the present invention.

With the etching completed, the hybrid assemblies can be formed into a tiled array on a common baseplate. This is accomplished as illustrated in FIG. 5 for two hybrid assemblies 10. A baseplate 30 on which the tiled array is to be mounted is provided. A plurality of indium bumps 32 are deposited on baseplate 30, typically in a dense array, where the hybrid assemblies are to be mounted. The bottom sides of the hybrid assemblies 10 are then pressed onto the indium bumps 32 using a hybridizing machine; the indium bumps serve to affix the hybrid assemblies to the baseplate.

A hybridizing machine is employed because of its ability to place the hybrid assemblies precisely. A hybridizing machine capable of placing hybrid assemblies on a baseplate with an accuracy of ±1 µm is preferred. One suitable machine is the FC150 Automated Die/Flip Chip Bonder manufactured by Smart Equipment Technology. Once the hybrid assemblies have been mounted to baseplate 30, epoxy is preferably wicked into the gaps between said indium bumps. This method is well-suited to applications in which multiple hybrid assemblies need to be formed into a tiled array in which the hybrids are very close together, such as ≤10 µm apart.

Figure 6:
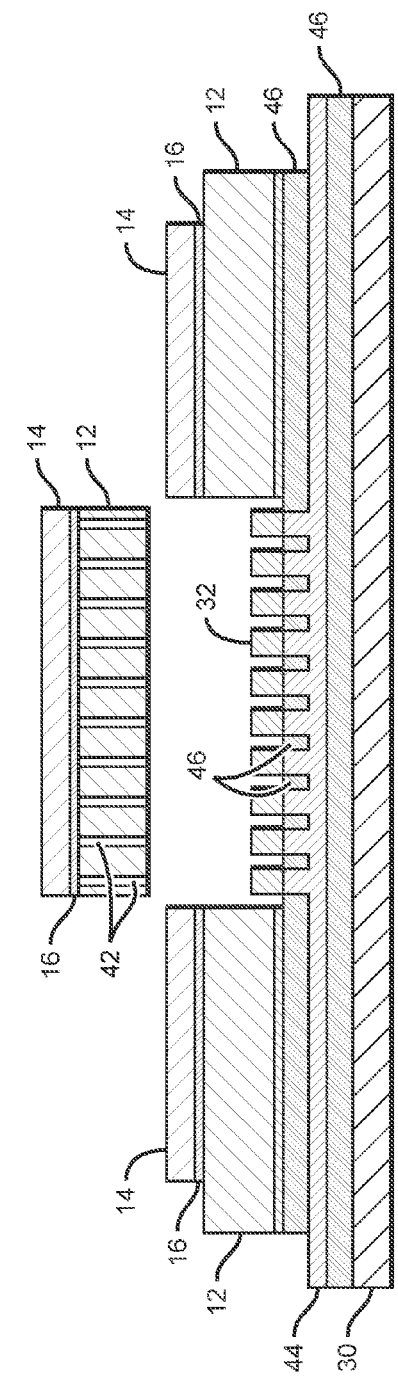
FIG. 6 illustrates the use of through-substrate vias with a hybrid assembly as might be used in a tiled array per the present invention, to enable electrical connection to a tile that is surrounded by other tiles on all four sides.

For many hybrid assemblies, a portion of the top surface of the first die is left exposed, such as area 40 in FIG. 5. This may be done to, for example, enable electrical connections to be made to the hybrid assembly by means of wire bonds (not shown) to contacts located on the exposed surface. This technique works well as long as the hybrid assembly is along the outer perimeter of the tiled array, so that the exposed surface area can be easily accessed. However, if a hybrid assembly is surrounded by other hybrid assemblies, as would be the case for the center hybrid assembly in a 3×3 array, this approach will not work. This problem may be circumvented by forming through-substrate vias (TSVs) 42 through at least a portion of such a land-locked 'internal' hybrid assembly, as illustrated in FIG. 6. In this case, indium bumps 32 may be used to both affix the hybrid assembly, and to carry electrical signals from the hybrid assembly 10 to an electrical interconnection layer 44 on baseplate 30. When so arranged, insulation layers and regions 46 may be needed to accommodate the electrical interconnections. This arrangement enables arbitrarily large arrays to be formed.

Baseplate 30 may serve as a heat sink. One preferred material for baseplate 30 is copper tungsten (CuW). The CuW is chosen because its coefficient of thermal expansion (CTE) closely matches the CTEs of CdZnTe and GaSb, and it forces the CTE of the silicon to more closely match that of the CdZnTe or GaSb, reducing the thermally induced strain in these materials due to cooling or heating of the assembly.

Figure 7A:
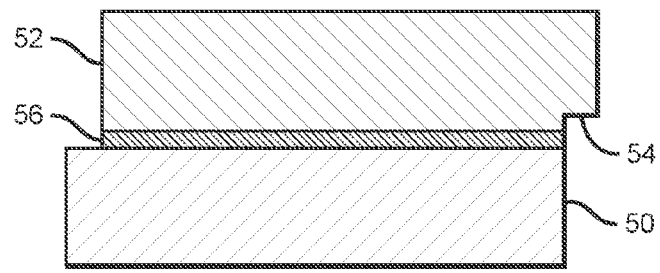
FIGS. 7A and 7B illustrate an alternative hybrid assembly fabrication method.
Figure 7B:
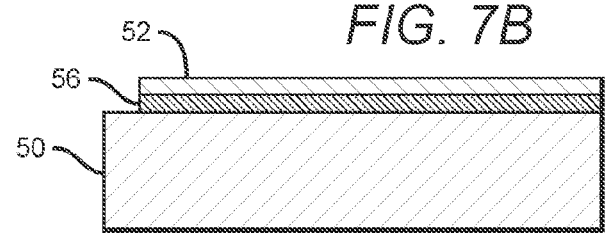

An alternative hybrid assembly fabrication method is illustrated in FIGS. 7A and 7B. As before, a hybrid assembly comprises a first die 50 and a second die 52. First die 50 may be, for example, a RIIC, and the second die 52 may be, for example, a SLED die which has been diced from a SLED wafer. As shown in FIG. 7A, vertical steps 54 with vertical side walls are etched into the SLED wafer prior to its being diced. The wafer is then diced to produce second dies 52. Each second die 52 can then be hybridized to a first die 50, aligning the vertically etched edges on the two die. The first and second dies are bonded and electrically interconnected together using indium bumps and epoxy, represented by layer 56. In FIG. 7B, the hybrid assembly is preferably thinned, by fly-cutting or mechanically lapping, for example, to eliminate the second die's overhanging substrate (typically GaSb when second die 52 is a SLED). The indium interconnecting the two die, and especially the epoxy that strengthens the indium joint, cannot tolerate high temperatures (>60° C.). Etching the steps 54 before the epoxy is in place as described above makes temperature less of an issue.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:
1. A method of forming a tiled array of hybrid assemblies on a baseplate, comprising:
   forming a plurality of hybrid assemblies, each of which comprises:
      a first die; and
      a second die mounted on and interconnected with said first die;

etching each vertical edge of said second dies which is to be located adjacent to a vertical edge of another second die in said tiled array such that said etched vertical edge is aligned with a vertical edge of said first die;
providing a baseplate on which said tiled array is to be mounted;
depositing a plurality of indium bumps on said baseplate where said hybrid assemblies are to be mounted; and
pressing said hybrid assemblies onto said indium bumps using a hybridizing machine.

2. The method of claim 1, further comprising wicking epoxy into the gaps between said indium bumps.

3. The method of claim 1, wherein adjacent edges of hybrid assemblies in said tiled array are ≤10 μm apart.

4. The method of claim 1, wherein said etching comprises a dry plasma etch.

5. The method of claim 1, wherein said etching comprises:
thinning the substrate of said second die; and
performing a wet etch on said thinned second die and said first die.

6. The method of claim 1, wherein said first die comprises a readout IC (ROIC) and said second die comprises a detector comprising an array of detector pixels mounted on and interconnected with said ROIC.

7. The method of claim 6, wherein said detector is a mercury cadmium telluride (MCT) detector on a CdZnTe substrate.

8. The method of claim 7, wherein said etching comprises:
thinning said CdZnTe substrate;
depositing a photoresist on the surface of said second die opposite said first die; and
wet etching said surface of said second die such that any portion of said second die which extends beyond a vertical edge of said first die is substantially removed.

9. The method of claim 1, wherein said first die comprises a read-in IC (RIIC) and said second die comprises an array of LEDs mounted to and interconnected with said RIIC.

10. The method of claim 1, wherein said second die comprises an array of superlattice LEDs (SLEDs) on a gallium antimonide (GaSb) substrate.

11. The method of claim 9, wherein said etching comprises:
depositing a layer on the surface of said first die opposite said second die which is resistant to a dry etchant; and
performing a dry etch such that said first die serves as an etching mask so that any portion of said second die which extends beyond a vertical edge of said first die is substantially removed.

12. The method of claim 1, further comprising forming through-substrate vias (TSVs) through at least a portion of at least one of said hybrid assemblies.

13. The method of claim 1, wherein said baseplate comprises copper tungsten (CuW).

14. The method of claim 1, wherein said hybridizing machine is capable of placing hybrid assemblies on said baseplate with an accuracy of ±1 μm.

15. The method of claim 1, wherein said hybridizing machine is a FC150 Automated Die/Flip Chip Bonder manufactured by Smart Equipment Technology.

16. A method of forming a tiled array of hybrid assemblies on a baseplate, comprising:
providing a plurality of first dies and a second wafer;
etching a plurality of steps, each with a vertical sidewall, into said second wafer;
dicing said second wafer into a plurality of second dies;
aligning the vertically etched edges of said second dies with the vertical edges of respective ones of said first dies;
bonding and electrically interconnecting said first dies to said second dies using indium bumps and epoxy to form a plurality of hybrid assemblies;
providing a baseplate on which said tiled array is to be mounted;
depositing a plurality of indium bumps on said baseplate where said hybrid assemblies are to be mounted; and
pressing said hybrid assemblies onto said indium bumps using a hybridizing machine.

17. The method of claim 16, further comprising thinning said second wafer such that any portion of said second wafer which is overhanging said first die is removed.

18. The method of claim 17, wherein thinning said second wafer comprises fly-cutting or mechanically lapping said second wafer.

19. A tiled hybrid array, comprising;
a baseplate;
a plurality of indium bumps on said baseplate;
a plurality of hybrid assemblies forming a tiled array mounted directly on said baseplate, at least a portion of each vertical edge of a hybrid assembly located adjacent to a vertical edge of another hybrid assembly being defined by an etch, said plurality of hybrid assemblies affixed to said baseplate via said indium bumps.

20. The tiled hybrid array of claim 19, wherein said baseplate is a heat sink.

21. The tiled hybrid array of claim 19, wherein said etched vertical edge portions are dry etched.

22. The tiled hybrid array of claim 19, wherein said etched vertical edge portions are wet etched.

23. The tiled hybrid array of claim 19, wherein each of said hybrid assemblies comprises:
a first die; and
a second die mounted on and interconnected with said first die, the vertical edges of said second die located adjacent to a vertical edge of another second die being said etched edges, said vertical edges etched to align with an edge of said first die.

24. The tiled hybrid array of claim 23, wherein
said first die comprises a readout IC (ROIC); and
said second die comprises a detector comprising an array of pixels mounted on and interconnected with said ROIC;
the vertical edges of detectors located adjacent to a vertical edge of another detector etched such that each etched vertical edge is aligned with a vertical edge of said ROIC.

25. The tiled hybrid array of claim 24, wherein said detector is a mercury cadmium telluride (MCT) detector.

26. The tiled hybrid array of claim 23, wherein
said first die comprises a read-in IC (RIIC); and
said second die comprises an array of LEDs mounted to and interconnected with said RIIC;
the vertical edges of LED arrays located adjacent to a vertical edge of another LED array etched such that each etched vertical edge is aligned with a vertical edge of said RIIC.

27. The tiled hybrid array of claim 26, wherein said second die comprises an array of superlattice LEDs (SLEDs) on a gallium antimonide (GaSb) substrate.

28. The tiled hybrid array of claim 19, wherein adjacent edges of hybrid assemblies in said tiled array are ≤10 μm apart.

29. The tiled hybrid array of claim 19, further comprising epoxy wicked into the gaps between said indium bumps.

30. The tiled hybrid array of claim 19, wherein said baseplate comprises copper tungsten (CuW).

31. The tiled hybrid array of claim 19, further comprising through-substrate vias (TSVs) through at least a portion of at least one of said hybrid assemblies.

\* \* \* \* \*